(12) United States Patent
Yu et al.

(10) Patent No.: US 6,348,288 B1
(45) Date of Patent: Feb. 19, 2002

(54) RESOLUTION ENHANCEMENT METHOD FOR DEEP QUARTER MICRON TECHNOLOGY

(75) Inventors: Shinn-Sheng Yu, Taichung; Hong-Chang Hsieh, Hsin-Chu, both of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/550,266

(22) Filed: Apr. 17, 2000

(51) Int. Cl.[7] .................................................. G03F 9/00
(52) U.S. Cl. ............................................................. 430/5
(58) Field of Search ............................ 430/5, 322, 323; 216/12; 250/492.2

(56) References Cited

U.S. PATENT DOCUMENTS

| 5,290,647 | A |   | 3/1994 | Miyazaki et al. | 430/5 |
|---|---|---|---|---|---|
| 5,418,095 | A |   | 5/1995 | Vasudev et al. | 430/5 |
| 5,514,498 | A | * | 5/1996 | Nakagawa | 430/5 |
| 5,536,603 | A |   | 7/1996 | Tsuchiya et al. | 430/5 |
| 5,747,196 | A |   | 5/1998 | Chao et al. | 430/5 |

* cited by examiner

*Primary Examiner*—S. Rosasco
(74) *Attorney, Agent, or Firm*—George O. Saile; Stephen B. Ackerman; Rosemary L. S. Pike

(57) ABSTRACT

A new process for fabricating a phase-shifting photomask is described. A photomask blank is provided comprising a chromium layer overlying a substrate and a resist layer overlying said chromium layer. The resist layer of the photomask blank is exposed to electron-beam energy and developed away whereby a first resist pattern remains. The chromium layer not covered by the first resist pattern is etched away and, simultaneously, the substrate not covered by the first resist pattern is etched into to a depth in nanometers of ¼ the wavelength of the exposure tool whereby a substrate step is formed underlying the first resist pattern. Thereafter, a portion of the first resist pattern is ashed away to leave a second resist pattern smaller than the first resist pattern and exposing portions of the chromium layer underlying the first resist pattern. The exposed portions of the chromium layer not covered by the second resist pattern are etched away whereby portions of the underlying substrate step are exposed. The second resist pattern is removed to complete fabrication of the phase-shifting photomask.

17 Claims, 4 Drawing Sheets

US 6,348,288 B1

RESOLUTION ENHANCEMENT METHOD FOR DEEP QUARTER MICRON TECHNOLOGY

BACKGROUND OF THE INVENTION (1) Field of the Invention

The invention relates to a process for fabricating a photomask, and more particularly, to a process for fabricating a phase-shifting photomask.

(2) Description of the Prior Art

As photolithography advances to 0.25 microns and below, new technologies are required to increase resolution of the imaging lens. One new technology is the use of phase-shifting photomasks. Phase shift masks take advantage of the interference effect in a coherent or partially coherent imaging system to reduce the spatial frequency of a given object, to enhance its edge contrast, or both.

FIG. 1A illustrates a top view of a typical binary mask 10 comprising a chromium portion 12 and a glass portion 14. FIG. 1B illustrates the electric field behind the mask of FIG. 1A. FIG. 1C illustrates the slope of intensity of the mask in FIG. 1A. FIG. 2A illustrates a top view of a phase-shifting mask 11. Chromium portion glass portion 14 are shown. The phase-shifting portion causes a 180° phase shift. The electric field behind this mask is shown in FIG. 2B. FIG. 2C shows the intensity slope of the mask in FIG. 2A. The higher slope of intensity in FIG. 2C than in FIG. 1C indicates higher contrast and therefore, better resolution in the phase-shifting mask as compared to a binary mask.

The partial transmittance of the light waves through the phase-shifting portion 16 allows for phase shifted light to be produced. While phase shift masks can enhance resolution and increase depth of field of the lithography process, they are on the order of five times as expensive to produce as binary masks. It is desired to find a process for making a phase shift mask that is both simple and inexpensive.

U.S. Pat. No. 5,747,196 to Chao et al discloses a process for forming a phase shift mask in which both a chromium layer and a light-transmissive layer are formed over glass. The two films are anisotropically etched to form a pattern where they are not covered by a resist. The resist is partially eroded away and then the chromium is etched away where not covered by the eroded resist to form the PSM. This process requires the use of a light-transmissive layer over the glass to form the phase-shifting portion which adds cost to the process. U.S. Pat. No. 5,290,647 to Miyazaki et al teaches a PSM process including using polysilicon as an etching mask. U.S. Pat. No. 5,418,095 to Vasudev and U.S. Pat. No. 5,536,603 to Tsuchiya et al disclose other processes for making phase shift masks.

SUMMARY OF THE INVENTION

Accordingly, it is a principal object of the present invention to provide an effective and very manufacturable process for fabricating a phase-shifting photomask.

Another object of the present invention is to provide a process of fabricating a phase-shifting photomask using a dry etch process to etch the glass of the mask a step high where the step height is equal to ¼ wavelength of the exposure tool.

Yet another object of the present invention is to provide a process of fabricating a phase-shifting photomask using an ashing process to pattern the light-blocking film.

A further object is to provide a process of fabricating a phase-shifting photomask using a dry etch process to etch the glass of the mask a step high where the step height is equal to ¼ wavelength of the exposure tool and using an ashing process to pattern the light-blocking film.

A still further object is to provide a process for fabricating a phase-shifting photomask in which an additional light-transmissive film is not required to form the phase-shifting portion of the photomask.

In accordance with the objects of this invention a new process for fabricating a phase-shifting photomask is achieved. A photomask blank is provided comprising a chromium layer overlying a substrate and a resist layer overlying said chromium layer. The resist layer of the photomask blank is exposed to electron-beam energy and developed away whereby a first resist pattern remains. The chromium layer not covered by the first resist pattern is etched away and, simultaneously, the substrate not covered by the first resist pattern is etched into to a depth in nanometers of ¼ the wavelength of the exposure tool whereby a substrate step is formed underlying the first resist pattern. Thereafter, a portion of the first resist pattern is ashed away to leave a second resist pattern smaller than the first resist pattern and exposing portions of the chromium layer underlying the first resist pattern. The exposed portions of the chromium layer not covered by the second resist pattern are etched away whereby portions of the underlying substrate step are exposed. The second resist pattern is removed to complete fabrication of the phase-shifting photomask.

BRIEF DESCRIPTION OF THE DRAWINGS

In the accompanying drawings forming a material part of this description, there is shown.

DESCRIPTION OF THE PREFERRED EMBODIMENTS

Figure 1A:
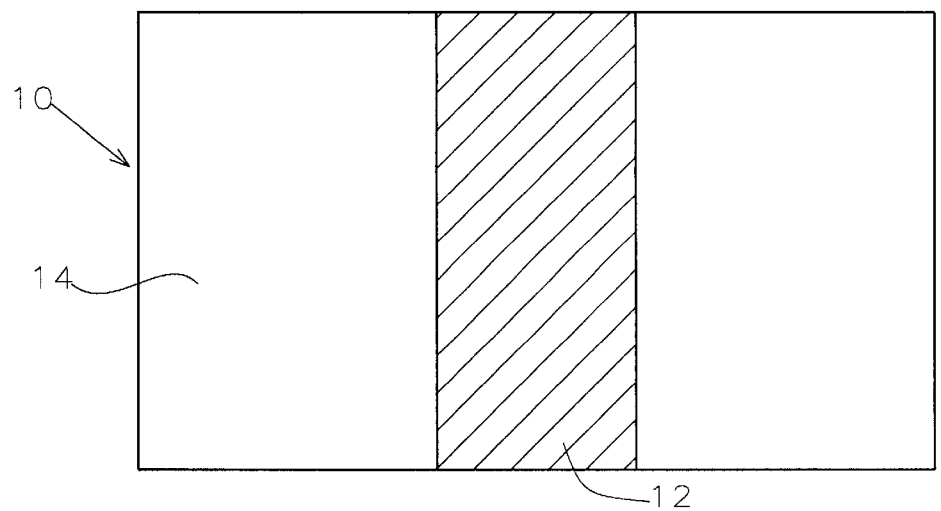
FIG. 1A schematically illustrates in top view a binary photomask.
Figure 1B:
FIG. 1B schematically illustrates the electric field behind the photomask illustrated in FIG. 1A.
Figure 1C:
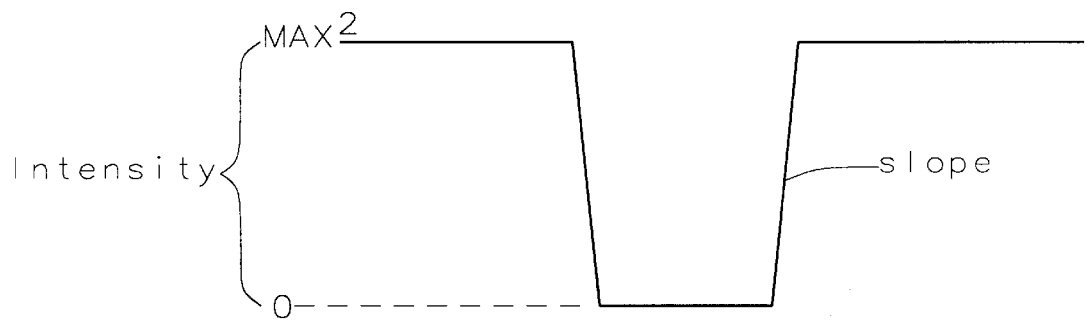
FIG. 1C schematically illustrates the intensity slope of the photomask illustrated in FIG. 1A.
Figure 2A:
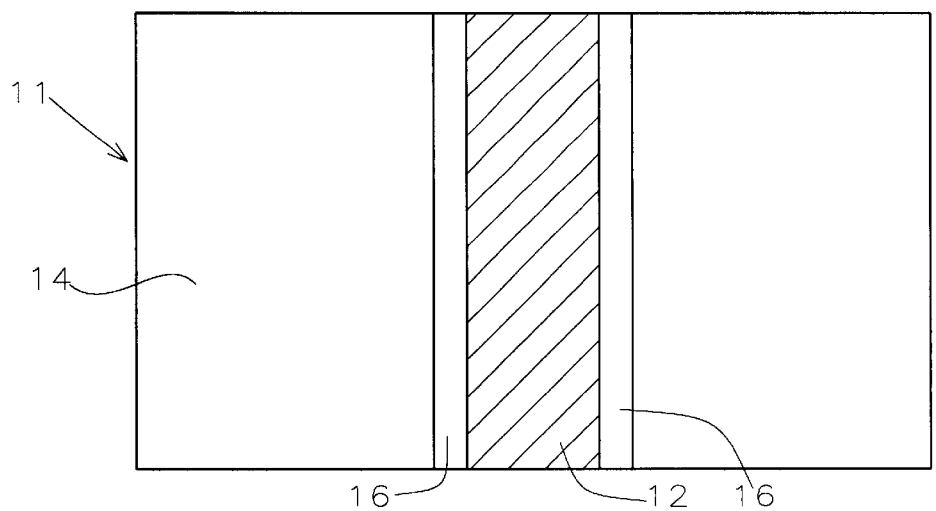
FIG. 2A schematically illustrates in top view a phase-shifting photomask.
Figure 2B:
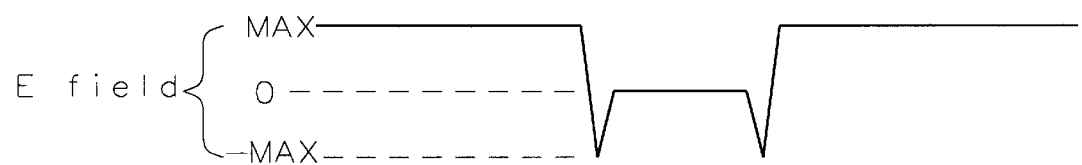
FIG. 2B schematically illustrates the electric field behind the photomask illustrated in FIG. 2A.
Figure 2C:
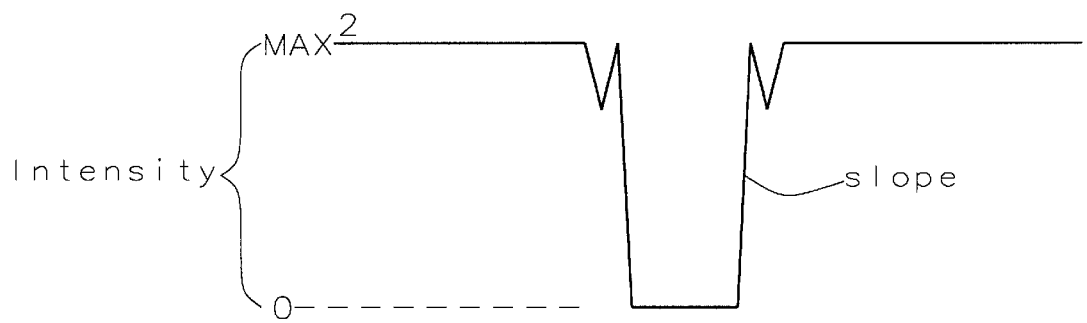
FIG. 2C schematically illustrates the intensity slope of the photomask illustrated in FIG. 2A.
Figure 3:
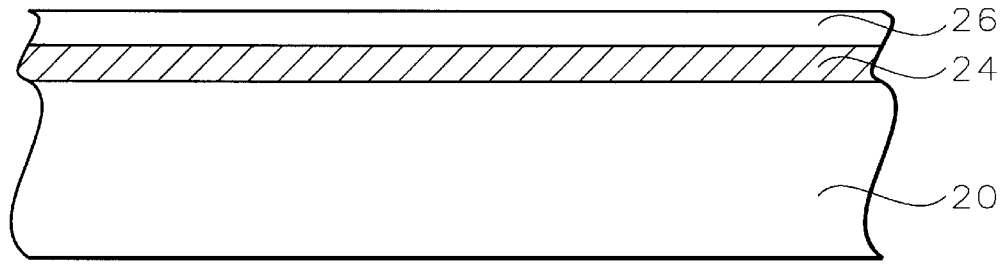
FIGS. 3 through 9 schematically illustrate in cross-sectional representation a preferred embodiment of the fabrication of a phase-shifting photomask of the present invention.

Referring now to FIG. 3, there is shown an illustration of a partially completed photomask. The photomask blank is a standard blank including a substrate 20, comprising glass such as a quartz plate. A layer 24 of chromium has been deposited over the substrate 20 to a thickness of between about 500 and 1000 Angstroms. A layers of E-beam resist 26 is coated over the chromium layer.

Figure 4:
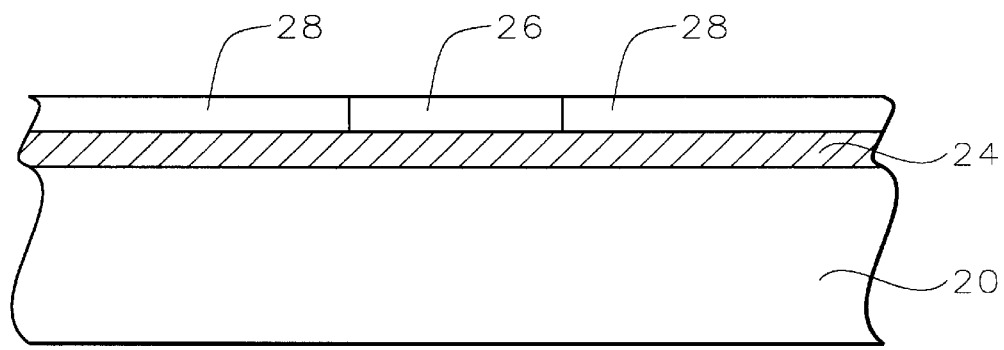
Figure 5:
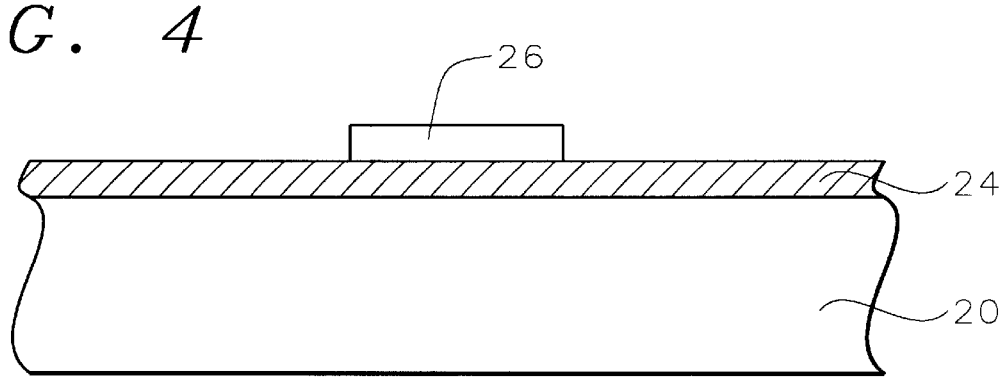

The PSM blank is exposed to Electron beam lithography, as shown in FIG. 4. The portion 28 has been exposed. The resist is developed, as shown in FIG. 5, leaving the unexposed resist 26, as shown.

Figure 6:
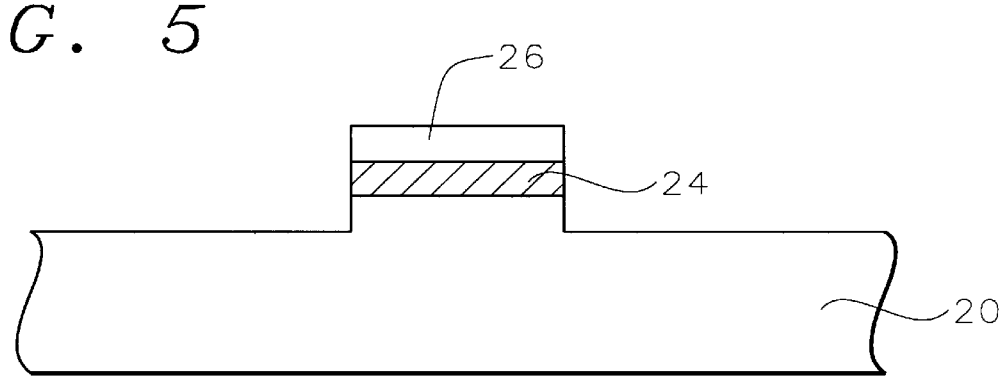

Referring now to FIG. 6, the chromium layer 24 is etched away where it is not covered by the resist 26. Etching continues into the glass substrate 20 to a depth of in nanometers of ¼ the wavelength of the exposure tool. For example, wavelengths of the exposure tool may be 365 nm, 248 nm, 193 nm, or 157 nm. This is dry etching, for example, using an etching gas of $Cl_2$, He, $O_2$, or $CO_2$. The lower portion of the glass substrate will phase shift the light by 180° since it has been etched into by ¼ wavelength.

Sufficient control of the key ¼ wavelength step height etch can be achieved by controlling or tuning of the dry etch machine.

Figure 7:
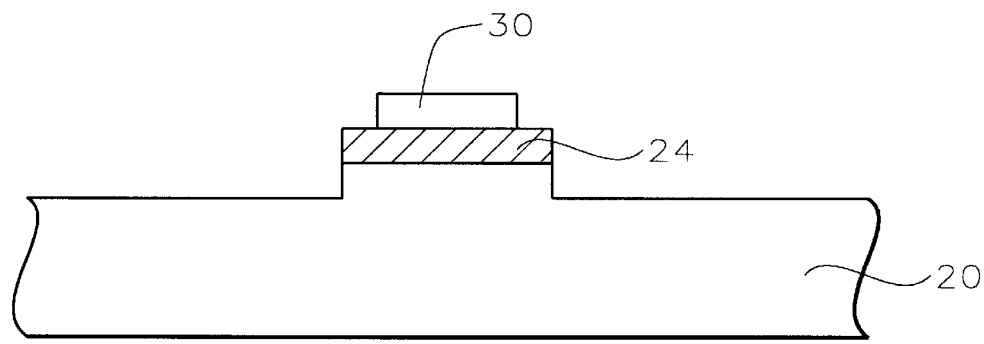

Referring now to FIG. 7, the resist 26 is ashed away partially to narrow its linewidth, as shown by 30. Plasma ashing is known in wafer processing, but is not used currently in mask processing. Specifically, an $O_2$ plasma plus a passivating gas, for example, $N_2$, Ar, or $Cl_2$, is used. Ashing time required is between about 10 to 60 seconds, depending on the critical dimension required. Typically, about 0.02 μm of the resist 26 per side is ashed away.

Figure 8:
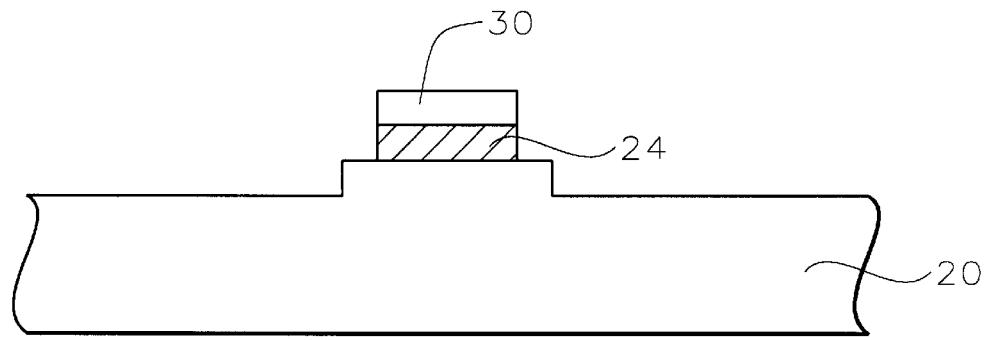

Next, the chromium layer 24 is etched away where it is not covered by the remaining resist 30, as shown in FIG. 8. The remaining resist 30 is then removed, as is conventional.

Figure 9:
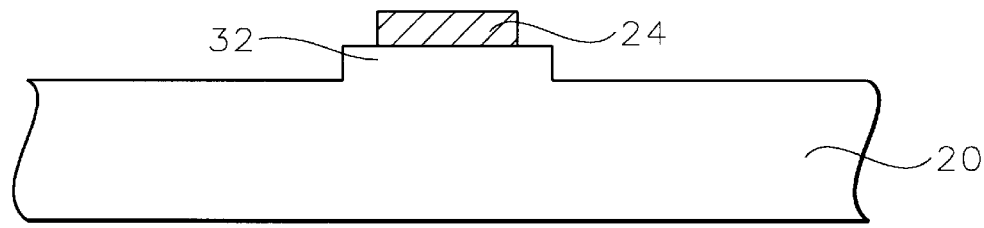

FIG. 9 illustrates the resulting phase-shifting mask. The mask consists of a glass substrate 20 having a portion of the glass 32 a step height higher than the substrate where the step height is ¼ of the wavelength of the exposure tool to be used (in nanometers). Overlying the glass step and horizontally narrower than the step by between about 0.02 to 0.03 microns is the chromium portion 24.

The process of the invention provides a new method to form a phase-shifting mask that is simpler and less costly than previous methods. No phase-shifting layer is required in the process of the invention; therefore, no special photomask blank is needed, so the blank is less expensive than in the prior art.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a phase-shifting photomask comprising:
   providing a photomask blank comprising a chromium layer overlying a substrate and a resist layer overlying said chromium layer;
   exposing said resist layer of said photomask blank to electron-beam energy and developing away said resist layer whereby a first resist pattern remains;
   etching away said chromium layer not covered by said first resist pattern and simultaneously etching into said substrate not covered by said resist pattern to a depth of ¼ of the wavelength in nanometers of an exposure tool in which said phase-shifting photomask is to be used whereby a substrate step is formed underlying said first resist pattern;
   thereafter ashing away a portion of said first resist pattern to leave a second resist pattern smaller than said first resist pattern and exposing portions of said chromium layer underlying said first resist pattern;
   etching away exposed said portions of said chromium layer not covered by said second resist pattern whereby portions of underlying said substrate step are exposed; and
   removing said second resist pattern to complete fabrication of said phase-shifting photomask.

2. The method according to claim 1 wherein said substrate is glass.

3. The method according to claim 1 wherein said substrate is quartz.

4. The method according to claim 1 wherein said chromium layer has a thickness of between about 500 and 1000 Angstroms.

5. The method according to claim 1 wherein said step of etching away said chromium layer and simultaneously etching into said substrate comprises a dry plasma etching wherein said etching gas comprises one of the group containing $Cl_2$, He, $O_2$, and $CO_2$.

6. The method according to claim 1 wherein said step of ashing comprises an $O_2$ plasma dry etch and passivation process.

7. The method according to claim 1 wherein said second resist pattern is between about 0.02 and 0.03 microns smaller than said first resist pattern.

8. A method of fabricating a phase-shifting photomask comprising:
   providing a photomask blank comprising a chromium layer overlying a substrate and a resist layer overlying said chromium layer;
   exposing said resist layer of said photomask blank to electron-beam energy and developing away said resist layer whereby a first resist pattern remains;
   etching away said chromium layer not covered by said first resist pattern and simultaneously etching into said substrate not covered by said resist pattern whereby a substrate step is formed underlying said first resist pattern wherein said substrate step has a thickness over said substrate in nanometers of ¼ the wavelength of an exposure tool in which said phase-shifting photomask is to be used;
   thereafter ashing away a portion of said first resist pattern to leave a second resist pattern smaller than said first resist pattern and exposing portions of, said chromium layer underlying said first resist pattern;
   etching away exposed said portions of said chromium layer not covered by said second resist pattern whereby portions of underlying said substrate step are exposed; and
   removing said second resist pattern to complete fabrication of said phase-shifting photomask.

9. The method according to claim 8 wherein said substrate is glass.

10. The method according to claim 8 wherein said substrate is quartz.

11. The method according to claim 8 wherein said chromium layer has a thickness of between about 500 and 1000 Angstroms.

12. The method according to claim 8 wherein said step of etching away said chromium layer and simultaneously etching into said substrate comprises a dry plasma etching wherein said etching gas comprises one of the group containing $Cl_2$, He, $O_2$, and $CO_2$.

13. The method according to claim 8 wherein said step of ashing comprises an $O_2$ plasma dry etch and passivation process.

14. The method according to claim 8 wherein said second resist pattern is between about 0.02 and 0.03 microns smaller than said first resist pattern.

15. A phase-shifting photomask comprising:
   a substrate having a step thereon wherein said step has a height in nanometers of ¼ of an exposure tool's wavelength over said substrate; and
   a chromium pattern overlying said substrate step and narrower than said substrate step by between 0.02 and 0.03 microns.

16. The photomask according to claim 15 wherein said substrate is glass.

17. The photomask according to claim 15 wherein said substrate is quartz.

* * * * *